July 29, 1958 A. R. GOBAT ET AL 2,845,375

METHOD FOR MAKING FUSED JUNCTION SEMICONDUCTOR DEVICES

Filed June 11, 1956

INVENTORS
ANDRE R. GOBAT
HENRY G. NORDLIN
BY Henry Kolin
AGENT

United States Patent Office 2,845,375

Patented July 29, 1958

2,845,375

METHOD FOR MAKING FUSED JUNCTION SEMICONDUCTOR DEVICES

Andre R. Gobat, North Caldwell, and Henry G. Nordlin, Livingston, N. J., assignors to International Telephone and Telegraph Corporation, Nutley, N. J., a corporation of Maryland Application June 11, 1956, Serial No. 590,654

5 Claims. (Cl. 148—1.5)

This invention relates to semiconductive circuit elements and methods of preparing them and more particularly to an improved method for preparing an alloy-junction transistor.

Junction transistors are well-known semiconductive circuit elements and are generally prepared from either germanium or silicon as the semiconductive material. In the junction transistor, a zone of one type of conductivity is located between zones of opposite conductivity type. Where these junction transistors are of the grown-junction type, they are usually prepared by a crystal-pulling technique in which a single crystal is grown by gradually withdrawing a seed crystal from a melt. The junctions are formed by selective doping of the melt at the desired points. Where the junction transistors are formed by an alloying technique, these alloy-junction transistors are frequently prepared by alloying pellets of an alloying material having significant impurities of the proper type to either side of a semiconductive wafer, the alloying materials forming emitter and collector junctions with the wafer over their area of contact and thereby forming an alloy-junction transistor.

Where silicon is the semiconductive material, it has been found that in order to obtain silicon semiconductor devices having reproducible properties, satisfactory reliability and reasonably satisfactory electrical characteristics, such as gain, noise figure, frequency range and power, the silicon used should preferably be of a high degree of purity. Similar purity considerations apply where a germanium transistor is to be prepared.

These alloy-junction semiconductors are of the n-p-n or p-n-p type. Electrical contact is made to each of the three zones, and the transistor unit is then encapsulated in a casing structure. As is well known to those skilled in this art, an n-p-n junction semiconductor is one containing a p layer sandwiched between two n layers. A semiconductor of the n type contains an excess of electrons, whereas that of the p type contains a deficiency of electrons. This deficiency of electrons is frequently referred to as an excess of "holes" or effective positive charges. Analogously, a p-n-p junction semiconductor contains two p zones separated by an intermediate n zone.

It has been found that the problem of forming alloy-junction transistors is an extremely troublesome one, particularly where the semiconductive element is silicon. Ordinarily, a batch process is employed wherein a pellet of the alloying material is placed in contact with the semiconductive germanium or silicon bar and then maintained at a selected temperature for a given length of time until alloying occurs. This technique does not readily lend itself to a mass production continuous process, control of the thickness of the junction is difficult, and spreading of the junction during alloying tends to blur the sharpness of the junction. This results in alloy-junction transistors having non-uniform properties with respect to various desired parameters, such as frequency cutoff, for example, even when produced under presumably identical conditions.

It is an object of the present invention to provide a simple, reliable rapid method for forming alloy-junction semiconductive units.

It is still a further object to provide a method readily adaptable to mass fabrication techniques in forming p-n junctions and alloy-junction transistors.

It is a feature of this invention that substantially ohmic connections are made to a semiconductor unit, and an electric current is passed by means of these connections through this semiconductor unit to heat it to a desired alloying temperature while maintaining it in contact with alloying materials having significant impurities.

It is a further feature that the semiconductor unit has a portion thereof of reduced cross-sectional area so that the heating effect is primarily confined to the portion of reduced cross-sectional area.

Other objects and features of this invention and the means of attaining them will become apparent from the following figures and description thereof, wherein.

Figure 1:
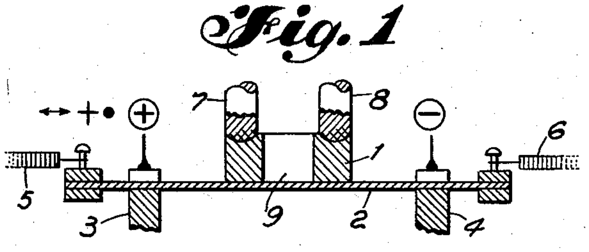
Fig. 1 is a perspective view of the forming of the ohmic connections on the semiconductor unit.

Referring to Fig. 1, a semiconductor unit 1 is shown cut to a suitable size and shape. The semiconductive material may consist preferably of n- or p-type germanium or n- or p-type silicon. The semiconductor units may be prepared from a larger slab of a crystal of semiconductive material that has already been suitably doped to give the desired conductivity type and resistivity. An ultrasonic cutting tool having a given mold shape may be used to form the semiconductor units from the larger slab. While the semiconductor unit illustrated in Fig. 1 has a U-shaped cross section, a unit having a dumbbell-shaped cross section would be equally suitable. It is primarily desired that the semiconductor unit have a shape such as to provide therein an intermediate portion of reduced cross-sectional area disposed between two other portions having greater cross-sectional areas.

In general, such units, particularly those of germanium and silicon, are etched in an appropriate etching solution, such as one consisting of a mixture of nitric, hydrochloric and glacial acetic acids, for a period of several minutes. They are then washed in distilled water and dried.

For purposes of illustration, in accordance with a preferred embodiment of this invention, the preparation of a semiconductor device using a p-type silicon unit will be described, although this invention is not restricted thereto.

Again referring to Fig. 1, the semiconductor unit 1 is placed upon a heater element 2 such as Nichrome in the form of a strip or ribbon which is suspended horizontally between two supporting brackets 3 and 4 held taut by two springs 5 and 6. By "Nichrome," I refer to that well-known series of high-temperature nickel-chromium alloys used for heating purposes. One such suitable composition consists of 80 percent nickel and 20 percent chromium and has a melting point of approximately 1400° C. While other methods of bringing the semiconductor unit to the desired temperature may be used, such as oven heating, dielectric heating, or the like, the described method is preferred. It should be understood that the semiconductor unit 1 in contact with the Nichrome ribbon 2 is preferably maintained in an atmosphere of dry nitrogen, and the subsequent operations are conducted in this atmosphere.

Manipulation of the devices is carried out in a so-called "dry box" containing this atmosphere of nitrogen. Dry nitrogen or similar substances, such as dry helium, are used in order to maintain the unit in as non-contaminating and as dry an atmosphere as feasible during the subsequent operations. Two aluminum wires 7 and 8 are held in position by suitable means against the first and second portions of the semiconductor bar and are located adjacent to, but not in contact with, the intermediate portion of reduced cross-sectional area. For purposes of this invention, the location of the wires 7 and 8 relative to one another may be varied provided they are not attached to the intermediate portion 9 of reduced cross-sectional area. Upon attaining a temperature above that of the silicon-aluminum eutectic, the aluminum wires fuse or alloy with the silicon unit. Inasmuch as aluminum is an acceptor material, non-rectifying substantially ohmic connections are formed with the p-type silicon. Where the semiconductor consists of n-type material, such as n-type germanium, the wires would be of a metal containing an n-type impurity and capable of alloying with the semiconductor. Gold containing 1 percent antimony might, for example, be used.

A method of heating a semiconductor unit using a Nichrome resistance element and of attaching leads to the unit has been described in conjunction with the forming of a grown-junction transistor in the copending application of J. M. Miller, Serial No. 545,631, filed November 8, 1955, and assigned to International Telephone and Telegraph Corporation, and reference may be had thereto for further illustrative details of this process.

Figure 2:
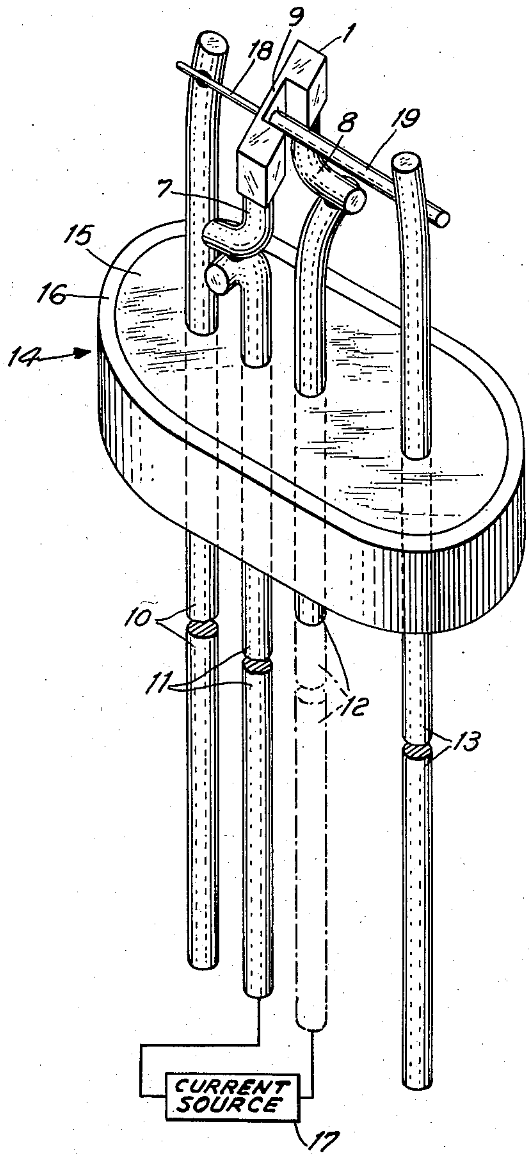
Fig. 2 is a perspective view of the completed unit mounted in its holder.

The semiconductor unit 1 is held in position in a terminal mount or header 14, as illustrated in Fig. 2. This header may be fastened to and manipulated by an convenient clamping means. While various headers may be used, the one illustrated preferably contains terminal leads 10, 11, 12 and 13 corresponding to the design for a tetrode device. These terminal leads are fused in position in the insulating support structure 14 containing a dielectric material 15, such as glass, which is held to and fused to the surrounding metallic structure 16, which is preferably made of a material such as Kovar which has a coefficient of expansion similar to that of glass and readily fuses therewith. By "Kovar," I refer to the well-known glass-sealing alloy consisting of approximately 20 percent nickel, 17 percent cobalt, 0.2 percent manganese and the balance iron. The two intermediate terminal leads 11 and 12 are attached by spot welding or soldering to the aluminum wires 7 and 8. Alternatively and preferably, the aluminum electrode wires may be first spot welded to the terminal leads before being connected to the semiconductor unit. It is considered immaterial for the practice of this invention whether the aluminum wires are first attached to the semiconductor unit and then to the terminal leads or whether they are first attached to the terminal leads and then lowered onto the semiconductor unit for alloying. This latter method requires less manipulation and is generally preferred as well as being readily amenable to mass production techniques. As mentioned, where the semiconductor unit consists of p-type silicon, a wire of aluminum or an alloy thereof is preferred to form an ohmic connection. Where the semiconductor unit consists of n-type silicon, a wire preferably made of a gold alloy, such as gold containing 1 percent antimony, would be used. While other metallic elements or alloys may be used for the electrode wires, generally speaking, in order to form a substantially ohmic connection it is preferred to use a donor-type material, such as gold-antimony or gold-arsenic, when alloying with n-type silicon and a wire made of aluminum, or alloys containing impurities such as indium or gallium for alloying with p-type silicon. Similar considerations would apply when forming an ohmic alloyed connection with n-type or p-type germanium, as is understood in this art.

After attachment of wires 7 and 8 to both the terminal leads and to the semiconductor unit as above described, a suitable source of alternating or direct current 17 is connected to terminal leads 11 and 12 so as to heat the semiconductor unit to a desired temperature by virtue of the $I^2R$ power loss in the semiconductor unit. Because of the reduced cross-sectional area of the intermediate portion 9 of the semiconductor bar, this intermediate portion has a greater resistance than the first and second portions with which it is connected in series and, therefore, will be elevated to a higher temperature above that of the adjacent first and second portions. During this heating process, a pair of antimony-doped gold wires 18 and 19 is brought in contact with opposing faces of the intermediate portion of p-type silicon, and in axial alignment with one another, to alloy therewith and form rectifying junctions therein. The first and second portions, i. e., those not of reduced cross-sectional area, will be at a lower temperature than the intermediate portion and, therefore, the alloyed bond formed between the aluminum wires and the p-type silicon will not be affected adversely. The antimony-doped gold wires from n-type regions in the intermediate portion of the p-type semiconductor unit, and, thereby, alloyed rectifying junctions are produced. Wires 18 and 19 are then securely attached to leads 10 and 13, respectively, by soldering, welding or other suitable means. After removal of current source 17, lead 12, illustrated in part in dotted outline, is cut, thereby giving a three-element transistor unit in which lead 13 corresponds to the collector lead, lead 10 corresponds to the emitter lead and lead 11 corresponds to the base connection. The described device may then be encapsulated to yield the completed semiconductor unit as is well known in this art.

If lead 12 is not cut, a tetrode device may be obtained by appropriate biasing of the terminals. It is, of course, understood that while this method has been described for the production of a transistor unit, it is readily adaptable for forming a single alloyed p-n junction where a semiconductor diode is desired, or a plurality of p-n junctions in sequence.

Figure 3:
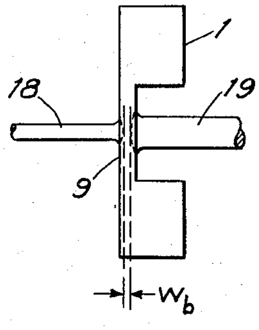
Fig. 3 is a top plan view of the semiconductor unit showing the rectifying connections.

In Fig. 3 is shown a top plan view of the alloy-junction transistor produced by the method of this invention. In general, for greatest efficiency, it is preferred to have the collector wire 19 of a greater diameter than the emitter wire 18, thereby enhancing the efficiency of the transport action of minority carriers across the region between the rectifying junctions. It will readily be realized that the method herein described is particularly suitable for the mass production of transistors having high alpha cut-off frequencies. Thus, a simple calculation using the relationship, $$f_{ca}=\frac{D}{\pi W_b^2}$$

shows that for an n-p-n silicon transistor a frequency cutoff, $f_{ca}$, of 10 megacycles would be obtained where $W_b$, the width of the base region between the junctions, is approximately four-tenths of a mil, where D is the diffusion constant for carriers injected into the base region. This value of the base width may readily be achieved by having the portion of reduced cross-sectional area of the p-type silicon approximately 3 to 5 mils in thickness and fusing a 2-mil antimony-doped gold wire on one side as emitter and a 6-mil antimony-doped gold wire on the other side as collector to a desired degree of alloying thereby obtaining the required base thickness.

The foregoing method offers many advantages over methods commonly used heretofore, in which a pellet is placed on a semiconductor unit which is then heated in an oven. In the method herein described, an oven is not required, and thereby a continuous conveyer-type operation may be readily achieved in place of a batch-type operation. The method herein described is equally suitable to other semiconductors in addition to the silicon unit herein illustrated.

Figure 4:
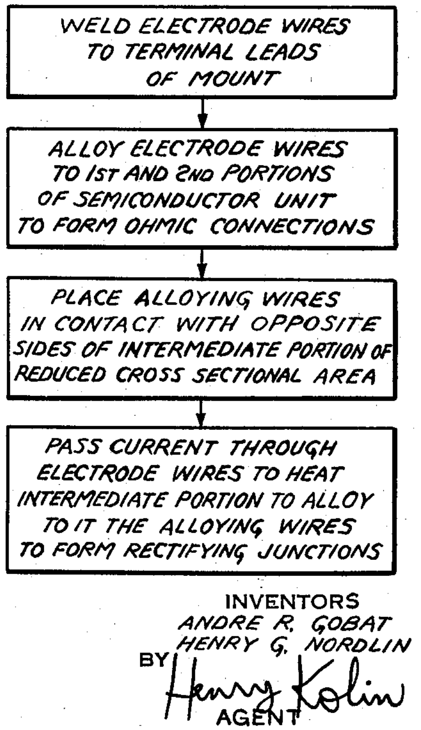
Fig. 4 is a flow chart of the steps followed in practicing a preferred embodiment of this invention.

The method described: of forming alloyed substantially ohmic connections to the semiconductor unit, passing current by means of these connections through the semiconductor unit to bring a portion of the semiconductor unit of reduced cross-sectional area to a desired temperature which is higher than the adjacent portions of greater area, and alloying to this reduced portion to form a junction or junctions, is preferred and is illustrated in Fig. 4. However, other means of heating the reduced portion by passage of current therethrough are contemplated as within the scope of this invention, although not preferred therefor. Thus, attachment for the passage of current may be made to the first and second portions by means of specially designed large-area clamping means.

While we have described above the principles of our invention in connection with specific method steps, it is to be clearly understood that this description is made only by way of example and not as a limitation to the scope of our invention as set forth in the objects thereof and in the accompanying claims.

We claim:

1. In a method for preparing a p-n junction in a semiconductor unit of substantially uniform resistivity wherein said unit comprises first and second portions with an intermediate portion therebetween of reduced cross-sectional area, whereby the temperature of said intermediate portion will be elevated above that of said first and second portions when an electric current is passed through said unit; the steps comprising making connections to said first and second portions to form a circuit through said intermediate portion, disposing an alloying material having significant impurities in contact with said intermediate portion, and passing current by means of said connections through said intermediate portion sufficient to elevate the temperature thereof to alloy thereto said alloying material.

2. In a method for preparing a p-n junction in a semiconductor unit of substantially uniform resistivity wherein said unit comprises first and second portions with an intermediate portion therebetween of reduced cross-sectional area, whereby the temperature of said intermediate portion will be elevated above that of said first and second portions when an electric current is passed through said unit; the steps comprising forming alloyed substantially ohmic connections to said first and second portions to form a circuit through said intermediate portion, disposing an alloying material having significant impurities in contact with said intermediate portion, and passing current by means of said connections through said intermediate portion sufficient to elevate the temperature thereof to alloy thereto said alloying material.

3. In a method for preparing an alloy-junction semiconductor unit having two zones of one conductivity type separated by an intermediate zone of opposite conductivity type, said two zones being contiguous with opposite faces of said intermediate zone, wherein said intermediate zone comprises first and second portions with an intermediate portion therebetween of reduced cross-sectional area, whereby the temperature of said intermediate portion will be elevated above that of said first and second portions when an electric current is passed through said unit; the steps comprising making connections to said first and second portions to form a circuit through said intermediate portion, disposing alloying materials having significant impurities in contact with opposing faces of said intermediate portion, and passing current by means of said connections through said intermediate portion sufficient to elevate the temperature thereof to alloy thereto said alloying materials.

4. In a method for preparing an alloy-junction semiconductor unit having two zones of one conductivity type separated by an intermediate zone of opposite conductivity type, said two zones being contiguous with opposite faces of said intermediate zone, wherein said intermediate zone comprises first and second portions with an intermediate portion therebetween of reduced cross-sectional area, whereby the temperature of said intermediate portion will be elevated above that of said first and second portions when an electric current is passed through said unit; the steps comprising forming alloyed substantially ohmic connections to said first and second portions to form a circuit through said intermediate portion, disposing alloying materials having significant impurities in contact with opposing faces of said intermediate portion, and passing current by means of said connections through said intermediate portion sufficient to elevate the temperature thereof to alloy thereto said alloying materials.

5. In a method for preparing an alloy-junction silicon transistor of the n-p-n type, wherein said intermediate p zone comprises first and second portions with an intermediate portion therebetween of reduced cross-sectional area, whereby the temperature of said intermediate portion will be elevated above that of said first and second portions when an electric current is passed through said unit; the steps comprising heating said unit to a temperature sufficient to alloy thereto acceptor-type conductors, alloying to said first and second portions acceptor-type conductors to form substantially ohmic connections to provide a circuit through said intermediate portion, disposing alloying materials of a donor type in contact with opposite faces of said intermediate portion, and passing current by means of said connections through said intermediate portion sufficient to elevate the temperature thereof to alloy thereto said alloying materials.

References Cited in the file of this patent

FOREIGN PATENTS 1,038,658 France ---------------- May 13, 1953